United States Patent
Muellner

(10) Patent No.: US 9,729,359 B1
(45) Date of Patent: Aug. 8, 2017

(54) METHODS AND APPARATUS FOR TRANSPONDER OSCILLATOR WITH OPTIMIZED TIMING

(71) Applicant: TEXAS INSTRUMENTS DEUTSCHLAND GMBH, Freising (DE)

(72) Inventor: Ernst Georg Muellner, Munich (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 0 days.

(21) Appl. No.: 15/392,174

(22) Filed: Dec. 28, 2016

(51) Int. Cl.
*H04B 1/38* (2015.01)
*H04L 25/03* (2006.01)
*H03K 3/356* (2006.01)
*G07C 9/00* (2006.01)
*B60R 25/20* (2013.01)

(52) U.S. Cl.
CPC .... *H04L 25/03834* (2013.01); *B60R 25/2063* (2013.01); *G07C 9/00007* (2013.01); *H03K 3/356017* (2013.01); *B60R 2325/10* (2013.01)

(58) Field of Classification Search
CPC .......... H04L 25/03834; H04L 27/2601; H04L 1/0025; H04L 1/0003; H04L 1/0071; H04L 5/0007; H04L 1/0009; H04L 27/0008; B60R 25/2063; B60R 2325/10; G07C 9/00007; H03K 3/356017; H04B 1/40; H04B 3/23; H04B 1/403
USPC ......................................... 375/219, 316, 295
See application file for complete search history.

(56) References Cited

U.S. PATENT DOCUMENTS

| | | |
|---|---|---|
| 2009/0174592 A1 | 7/2009 | Muellner |
| 2009/0189688 A1 | 7/2009 | Nehrig et al. |
| 2010/0141389 A1 | 6/2010 | Hagl et al. |
| 2012/0092055 A1 | 4/2012 | Peschke et al. |
| 2012/0161942 A1 | 6/2012 | Muellner et al. |
| 2013/0009706 A1 | 1/2013 | Peschke et al. |

(Continued)

OTHER PUBLICATIONS

U.S. Appl. No. 15/459,696, entitled Integrated Circuits and Transponder Circuitry with Shared Modulation Capacitor for 3D Transponder Uplink Modulation, filed Mar. 15, 2017 (34 pages).

(Continued)

*Primary Examiner* — Zewdu Kassa
(74) *Attorney, Agent, or Firm* — John R. Pessetto; Charles A. Brill; Frank D. Cimino

(57) ABSTRACT

Circuitry includes: a resonant circuit for receiving a radio frequency signal; a rectifier outputting a first rectified signal matching a portion of the radio frequency signal and a second rectified signal having portion that matches the radio frequency signal and is out of phase with the first rectified signal; a clock regenerator circuit outputting a clock waveform corresponding to the first and second rectified signals; an oscillator timing circuit forming a first sloped waveform having a linear slope and a second sloped waveform having a linear slope, and comparators to compare the first sloped waveform and the second sloped waveform. The oscillator timing circuit outputs a master clock signal having transitions when the first and the second sloped waveform have equal magnitudes. A pluck pulse generator forms a pulse of a predetermined length when the master clock signal transitions.

20 Claims, 10 Drawing Sheets

(56) References Cited

U.S. PATENT DOCUMENTS

2015/0145651 A1    5/2015  Muellner et al.
2016/0328637 A1*  11/2016  Viikari ............... G06K 19/0717

OTHER PUBLICATIONS

U.S. Appl. No. 15/459,738, entitled Integrated Circuits and Transponder Circuitry with Improved ASK Demodulation, filed Mar. 15, 2017 (44 pages).

* cited by examiner

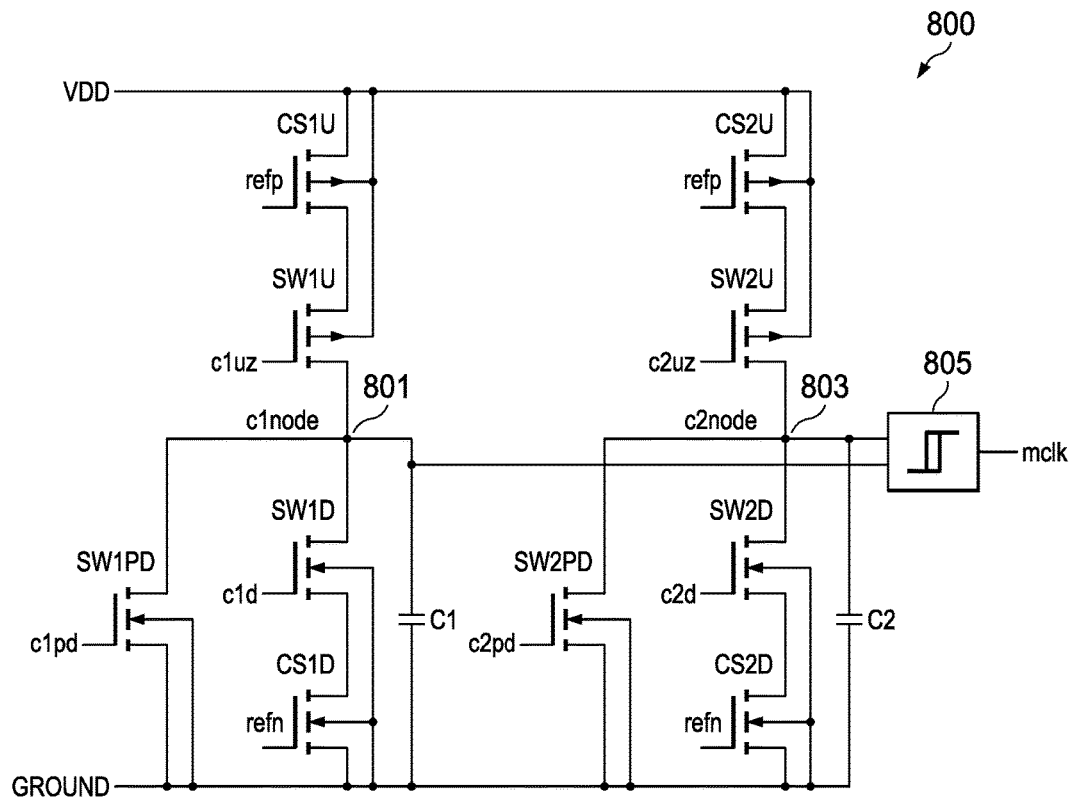
FIG. 8
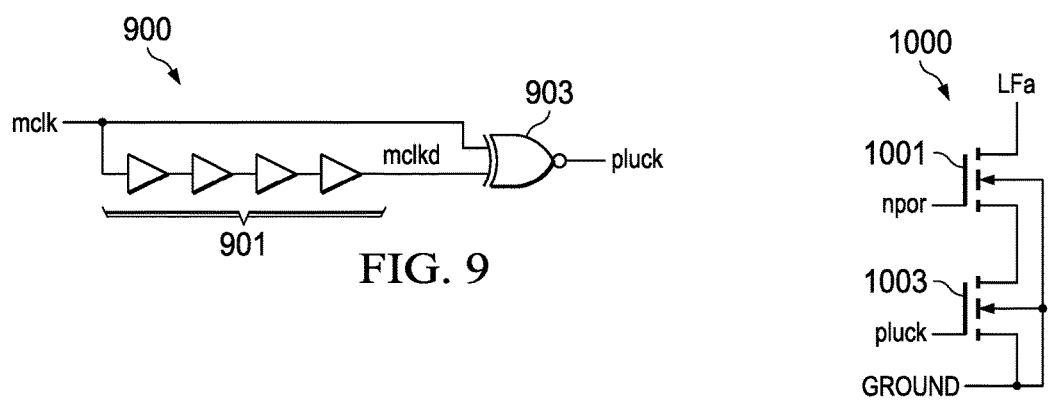
FIG. 9
FIG. 10

METHODS AND APPARATUS FOR TRANSPONDER OSCILLATOR WITH OPTIMIZED TIMING

CROSS-REFERENCE TO RELATED APPLICATIONS

This application relates to co-owned and co-assigned U.S. patent application Ser. No. 15/392,234, filed contemporaneously with the present application, entitled "METHODS AND APPARATUS FOR ANTENNAS SIGNAL LIMITER FOR RADIO FREQUENCY IDENTIFICATION TRANSPONDER", naming Ernst Georg Muellner as inventor, which is hereby incorporated by reference in its entirety herein.

TECHNICAL FIELD

This relates generally to radio receivers and transmitters, and more particularly to low power and low frequency radio frequency identification transponders.

BACKGROUND

RFID (radio frequency identification) systems are widely used in the automotive industry and other industries such as farm animal identification, building access control, and meter reading. A primary application in the automotive industry is the portion of the anti-theft system that prevents a vehicle from being started without a key or a remote control device that has been electronically paired to a specific vehicle. RFID systems often include low power radio transponders. The transponder receives a radio signal from a base unit (also known as a "reader"). The reader may be built into a vehicle or other type of system. The transponder can be powered either by a power supply, a battery, or by energy harvested from the radio frequency (RF) field that is produced by the reader. Some transponders are primarily powered by a battery with the capability of being powered by the RF field when the battery cannot provide sufficient energy or when the battery is absent.

Upon receiving a specific RF signal from the reader, the transponder responds and transmits an RF signal with specific characteristics that can be detected by the reader. The RF signals generated by the reader and transponder are typically modulated with data. The data transmitted by the reader and transponder is system dependent. Data transmitted by the transponder may include a transponder identification code, the reading of a water meter, or data from a vehicle key to be validated by the anti-theft system. A transponder in a vehicle key or in the vehicle itself can be considered an "immobilizer" because, if the reader fails to receive the correct response from the transponder in the key or a key fob, the vehicle or equipment is disabled and may not start.

Efficient use of power by the transponder is desired in order to maximize battery life. Also, efficient use of power is necessary when operating with the small amount of energy that can be harvested from an RF field when the battery is absent or discharged.

SUMMARY

In described examples, circuitry includes: at least one antenna coupled to a resonant circuit for receiving a radio frequency signal; a rectifier outputting a first rectified signal matching a portion of the radio frequency signal and a second rectified signal having portion that matches the radio frequency signal and is out of phase with the first rectified signal; a clock regenerator circuit outputting a clock waveform corresponding to the first and second rectified signals; an oscillator timing circuit forming a first sloped waveform having a linear slope and a second sloped waveform having a linear slope, and comparators to compare the first sloped waveform and the second sloped waveform. The oscillator timing circuit outputs a master clock signal having transitions when the first and the second sloped waveform have equal magnitudes. A pluck pulse generator forms a pulse of a predetermined length when the master clock signal transitions.

BRIEF DESCRIPTION OF THE DRAWINGS

FIG. 8 is a circuit diagram for an example embodiment oscillator timing circuit.

FIG. 9 is a circuit diagram for the example embodiment pluck pulse generator circuit.

FIG. 10 is a circuit diagram for an example embodiment pluck circuit.

DETAILED DESCRIPTION OF EXAMPLE EMBODIMENTS

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figures herein that illustrate signal traces and timing diagrams are drawn such that time scales for all traces and timing diagrams within an individual figure (including a set of figures with the same base number such as FIGS. 4A-4C with the base figure number of 4) are approximately the same and are aligned vertically. The approximately simultaneously occurring states of all signals illustrated in a figure (including a set of figures with the same base number) are aligned vertically. The signal trace diagrams herein are drawn with representative and approximate waveform shapes. Signal delays through circuit elements are not illustrated unless important to the explanation of circuit operation.

Conventional low power transponders such as those used in automotive anti-theft systems are typically implemented with a resonant antenna circuit coupled to an oscillator. When a reader and transponder are engaged in communication, the resonant antenna circuit of the transponder is initially excited by the RF field generated by the reader. The RF field produced by the reader is typically a modulated sine wave with a fundamental frequency approximately equivalent to the natural resonant frequency of the resonant antenna circuit of the transponder. For cases where the transponder harvests energy from the RF field, the transponder typically rectifies the signal induced by the reader in the transponder antenna circuit. This rectified signal is used to charge a storage element in the transponder such as a capacitor. The transponder oscillator circuit internally generates a clock with a frequency approximately equivalent to the fundamental frequency of received RF signal. When the reader stops generating the RF field, this clock is utilized by the oscillator circuit to synchronize addition of energy to the resonant antenna circuit. This addition of energy sustains oscillation in the resonant antenna circuit in order for the transponder to respond to the reader.

Figure 1:
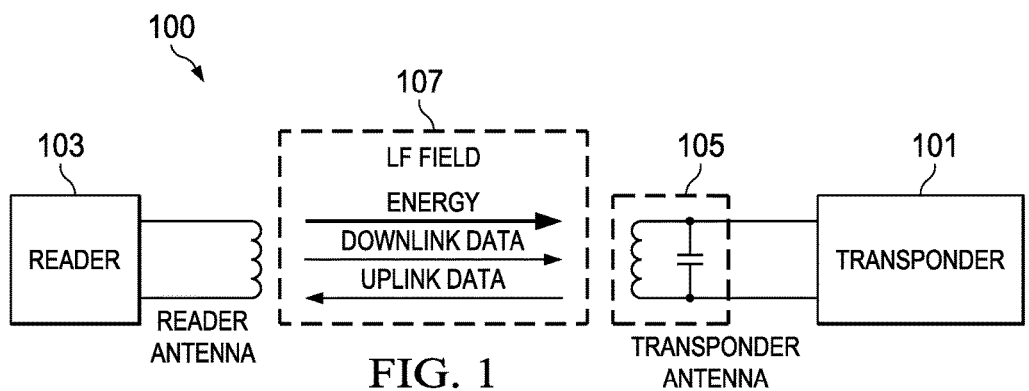
FIG. 1 is a block diagram for a conventional RFID system.

FIG. 1 is a block diagram for a conventional RFID system 100 operating at low radio frequency (LF). An example RF frequency employed in LF RFID systems is 134 kHz. Frequencies other than 134 kHz can be used. The "transponder" (block 101 of FIG. 1) operates in response to a query issued by a "reader" (block 103 of FIG. 1). Readers and transponders operating at low radio frequencies typically employ magnetically coupled antennas in close proximity. In a communication session, the reader initially generates an LF field at approximately the natural resonant frequency of transponder antenna tank circuit 105 of FIG. 1. The LF field generated by the reader supplies energy to the transponder by inducing an oscillation in the transponder antenna tank circuit 105 of FIG. 1. The voltage and current induced by the reader in the transponder antenna tank circuit is typically half-wave rectified and used to charge a capacitor that powers the transponder. The reader also modulates this LF field with data for the transponder. Amplitude shift keying (ASK) modulation is typically used by the reader. Data transmitted from the reader to the transponder is the "downlink" data. The transponder demodulates and processes the downlink data. The reader stops generating the LF field after completing the downlink transmission and after sufficient time has elapsed for the transponder to store sufficient energy to respond to the reader. After processing the downlink data, the transponder responds to the reader with data typically using frequency shift keying (FSK) modulation of the LF field. The LF field generated by the transponder and the reader are typically at approximately the same frequency.

The same antenna tank circuit is typically used by the transponder for both receive and transmit. Data transmitted by the transponder to the reader is the "uplink" data. The group of radio signals 107 of FIG. 1 represent the energy in the LF field supplied by the reader, the downlink data, and the uplink data. Transponders may be implemented that normally operate with energy supplied by a battery and that have the capability to operate with energy supplied by the LF field when insufficient energy is available from the battery, or when the battery is absent.

Conventional transponders can be implemented with multiple antennas. For example, three orthogonally positioned antennas are often used in RFID transponders where the relative orientation of the reader and transponder is not fixed. Conventional transponders implemented with multiple antennas often have separate receive and transmit circuits dedicated to each antenna in addition to common circuits. The common circuits typically include control functions and data processing.

When the reader completes the downlink transmission and stops generating the LF field, conventional transponders employ an oscillator to sustain oscillation in the antenna tank circuit (105 of FIG. 1) by adding energy to the antenna tank circuit. The energy added to the tank circuit by the oscillator temporarily increases the peak-to-peak voltage range of the antenna tank circuit oscillation.

Figure 2:
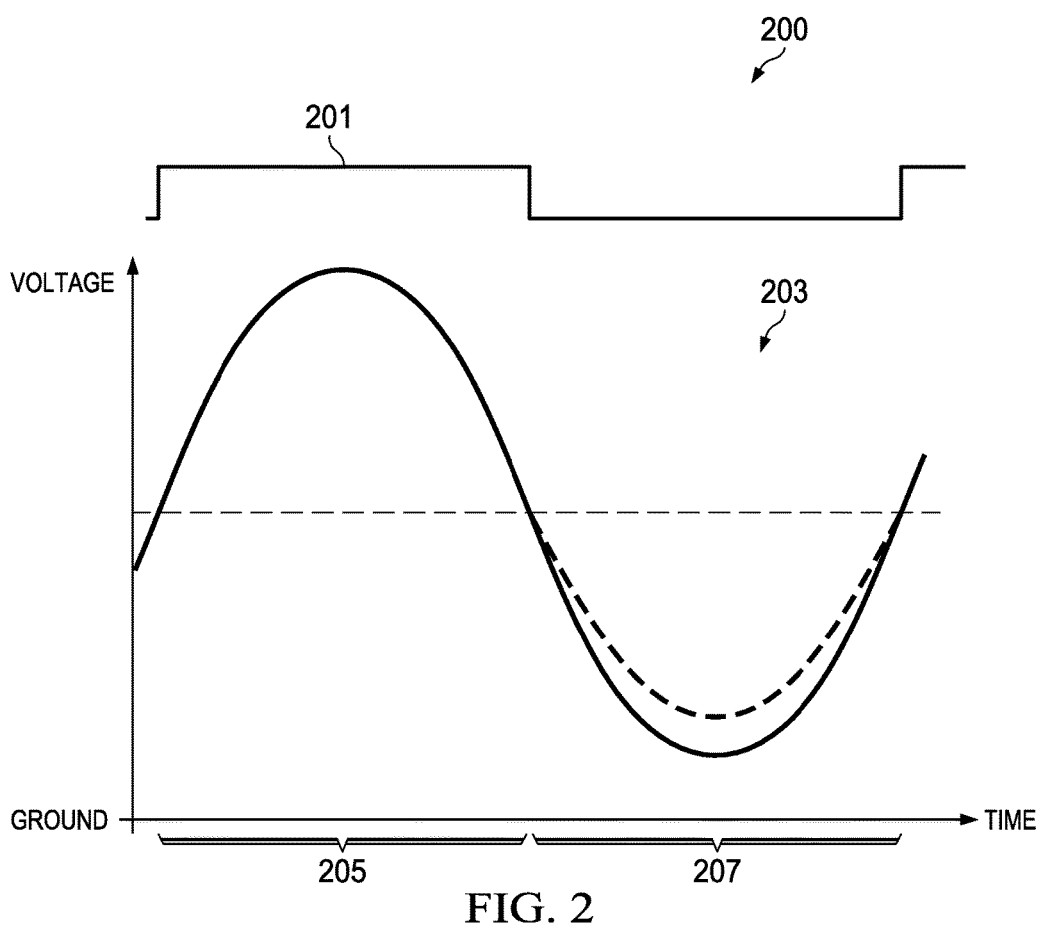
FIG. 2 is a timing diagram and a signal trace illustrating oscillator timing and the behavior of the antenna tank circuit for typical conventional transponders.

FIG. 2 is a set of signal traces 200 illustrating oscillator timing and the behavior of the antenna tank circuit for typical conventional transponders. In particular, FIG. 2 illustrates the operation of the transponder when energy is added to the antenna tank circuit (105 of FIG. 1). Trace 201 illustrates the oscillator clock, a logic level signal. Conventional transponders typically extract the clock signal (trace 201) from oscillation in the antenna tank circuit. This clock is generated when the reader is generating the LF field and when transponder oscillator is sustaining the oscillation in the antenna tank circuit. The solid line of trace 203 illustrates the voltage across the antenna tank circuit for one cycle of oscillation in the antenna tank circuit (105 of FIG. 1). During time period 205 in FIG. 2 no energy is being added to the antenna tank circuit by the oscillator. During time period 207 in FIG. 2, while the clock (trace 201 of FIG. 2) is low, the oscillator couples the antenna tank circuit to ground, increasing the peak-to-peak voltage of the oscillation and thus adding energy. The dashed line of trace 203 in FIG. 2 illustrates what the voltage across the tank circuit would be without this added energy (the dashed and solid line voltage illustrations in trace 203 of FIG. 2 are not to scale.) Other modifications to the waveform such as modulation are not illustrated for simplicity of explanation. Conventional transponders typically do not add energy to the antenna tank circuit during every cycle of oscillation.

Conventional transponders typically extract the clock (see trace 201 of FIG. 2) with a circuit that results in inaccurate timing. These timing inaccuracies are typically due to variation of circuit element characteristics, antenna tank circuit Q factor, and variations in operating conditions such as voltage and temperature. Timing inaccuracies of the oscillator clock (trace 201 of FIG. 2) results in energy being added to the antenna tank circuit with timing errors. The presence of these timing errors reduce energy efficiency and may reduce uplink communication quality.

Some conventional transponders are implemented with a phase locked loop (PLL) for improved timing accuracy of the oscillator clock. A PLL is typically sensitive to the antenna tank circuit Q factor. This sensitivity to Q factor can result in timing errors. A PLL may consume more power than other timing approaches.

Conventional transponders are typically implemented with additional circuits such as an RF signal limiter and rectifier, demodulator, modulator, and power supply. These additional circuits are not critical to the description of conventional transponder oscillators and are not described herein.

The description of conventional transponder oscillators herein is applicable to single antenna implementations and also to each antenna of multiple antenna implementations.

Figure 3:
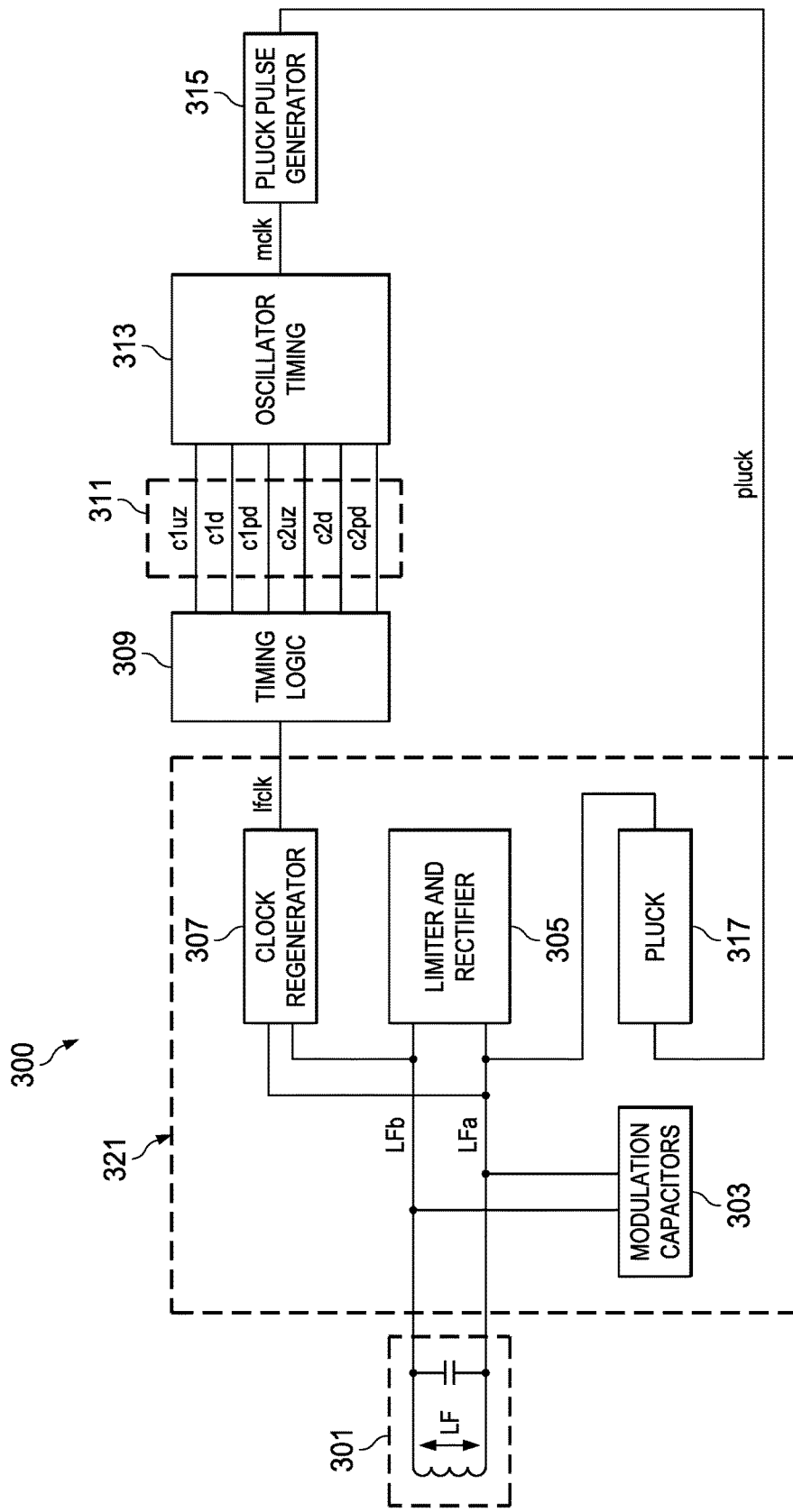
FIG. 3 is a block diagram for a portion of a low frequency RFID transponder including an example embodiment.

FIG. 3 is a block diagram for a portion of an example low frequency RFID transponder 300 illustrating an example embodiment. It should be noted that not all blocks necessary for a complete transponder system are included in FIG. 3, for simplicity of explanation.

In circuit 300, the transponder receive and transmit antenna is the resonant tank circuit 301 of FIG. 3. The signal labeled LF in FIG. 3 is the instantaneous voltage across the parallel combination of the inductive and capacitive elements of the antenna tank circuit (301 of FIG. 3). Circuits coupled to the antenna tank circuit that generate and modify the LF signal are the "modulation capacitors" circuit (block 303 of FIG. 3), the "limiter and rectifier" circuit (block 305 of FIG. 3), and the "pluck" circuit (block 317 of FIG. 3).

It should be noted that "LF field" is used herein in reference to the RF field that couples the reader and transponder and that "LF signal" is used herein in reference to the instantaneous voltage across an antenna tank circuit such as circuit 301 of FIG. 3.

The group of circuits 321 is also referenced hereinbelow in the description of FIG. 12.

The example embodiment is illustrated in FIG. 3 as the combination of the "clock regenerator" circuit (block 307 of FIG. 3), "timing logic" circuit (block 309 of FIG. 3), the "oscillator timing" circuit (block 313 of FIG. 3), the "pluck pulse generator" circuit (block 315 of FIG. 3), and the "pluck" circuit (block 317 of FIG. 3). The example embodiment is the oscillator portion of the transponder circuit 300. The reader described hereinabove generates an LF field that induces oscillation in the antenna tank circuit (301 of FIG. 3). When the reader stops generating the LF field, the example embodiment sustains the oscillation of the antenna tank circuit (301 of FIG. 3) by adding energy to the antenna tank circuit during each cycle of oscillation as described hereinbelow.

The signals labeled LFa and LFb in FIG. 3 are at the opposite sides of antenna tank circuit (301 of FIG. 3). The rectifier and limiter circuit (block 305 of FIG. 3) performs a full wave rectification of the LF signal as illustrated in FIG. 4 and described hereinbelow. The limiter and rectifier circuit (block 305 of FIG. 3) constrains the minimum and maximum voltage peaks of the signals LF, LFa, and LFb within the operating range of the transponder to prevent circuit damage and unpredictable circuit behavior. Signal limiting is not critical to the description of the example embodiment and is not further described herein for simplicity of explanation.

The signal labeled lfclk in FIG. 3 is generated by the example embodiment clock regenerator circuit (block 307 of FIG. 3) as described hereinbelow. The group of signals 311 of FIG. 3 labeled c1uz, c1d, c1pd, c2uz, c2d, and c2pd are timing signals generated by the example embodiment timing logic circuit (block 309 of FIG. 3). These signals are described hereinbelow. The master clock signal labeled mclk of FIG. 3 is generated by the example embodiment oscillator timing circuit (block 313 of FIG. 3) as described further hereinbelow. The signal labeled "pluck" in FIG. 3 is generated by the example embodiment pluck pulse generator circuit (block 315 of FIG. 3) as described hereinbelow.

To sustain the oscillation in the antenna tank circuit (block 301 of FIG. 3) with a peak-to-peak voltage differential sufficient for transponder operation, the example embodiment pluck circuit (block 317 of FIG. 3) replaces energy lost in the antenna tank circuit. The energy is added by the pluck circuit (block 317) synchronous with the LF signal by modifying the trajectory of the LFa signal as described hereinbelow. (Alternatively, the LFb signal could be modified instead).

The modulation capacitors (block 303 of FIG. 3) are utilized by the transponder 300 to modulate the LF signal with uplink data. This modulation and the modulation capacitors are not critical to the description of the example embodiment and are not further described herein for simplicity of explanation.

Additional circuits not critical to the description of the example embodiment are omitted from FIG. 3, for simplicity of explanation. The omitted circuits include but are not limited to downlink demodulation, downlink data processing, uplink data generation, modulation control, bias generation, reference generation, and power supply.

Circuits illustrated in FIG. 3 may require enable signals. Enable signals may include, for example, a signal indicating that the power supply is generating an adequate voltage level and a signal indicating that the transponder has switched from receive to transmit operation. Description of circuit operation herein does not include all enable signals. Circuit descriptions herein are based on circuits being enabled unless otherwise stated.

When implementing circuit 300 of FIG. 3 in an integrated circuit (IC), it may be advantageous to implement structural symmetry near external antenna tank circuit connections. In such a case some transponder circuits may be duplicated for symmetry on the IC, but not used when the transponder is operating. For example, to maintain symmetry a second pluck circuit block coupled to the LFb signal could be instantiated on an IC.

Transponders may be implemented with multiple antennas to improve performance when varying spatial orientations of reader and transponder are possible. The description herein of the transponder in the example of FIG. 3 is applicable to a single antenna implementation as well as to each antenna of a multiple antenna implementation. An example IC implemented for a system employing three antennas is illustrated in FIG. 12 described hereinbelow.

Figure 4A:
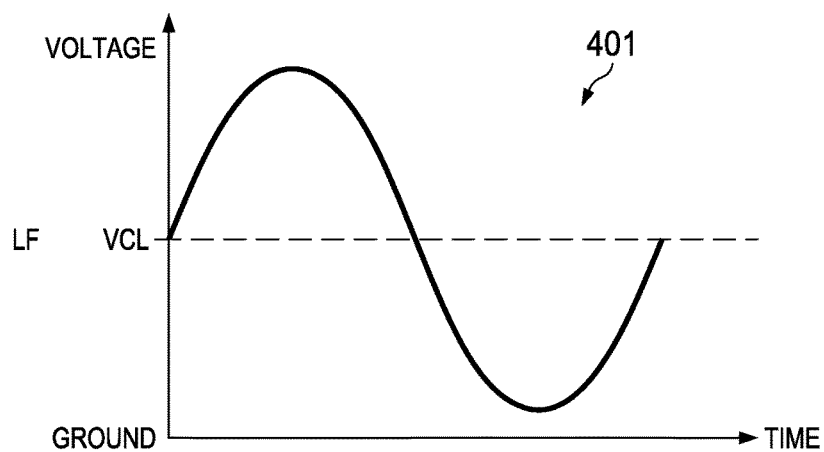
FIGS. 4A-4C are traces for a group of signals illustrating the result of the full-wave rectifier function.
Figure 4B:
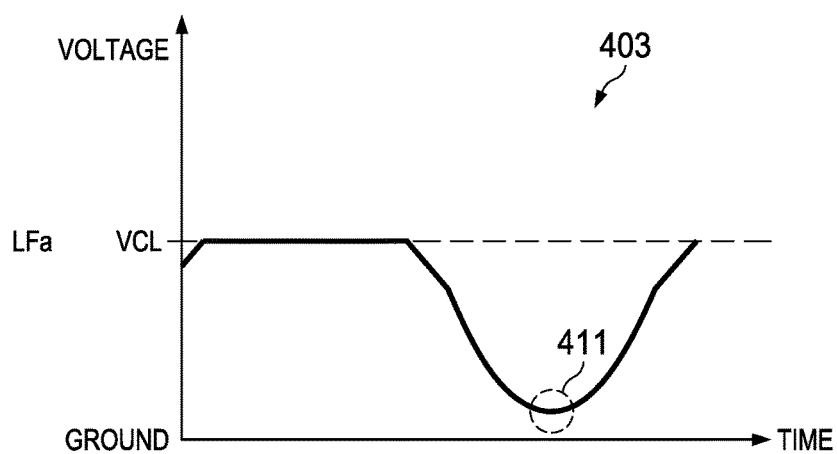
Figure 4C:
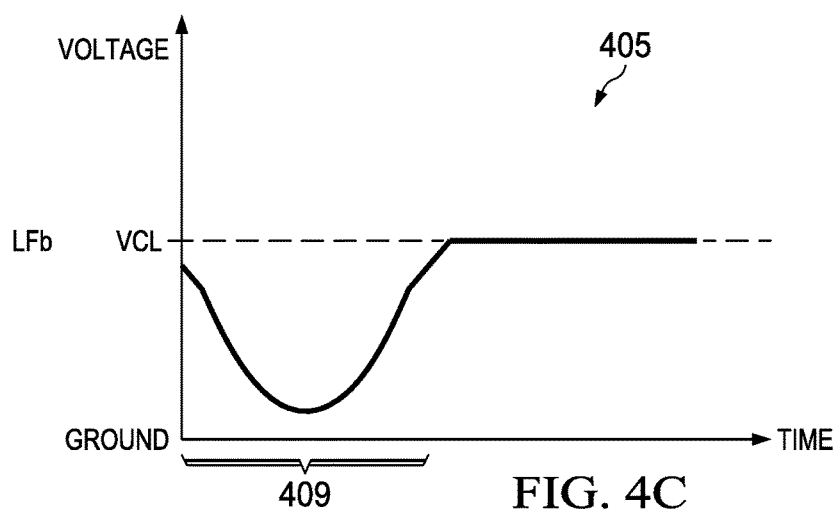

FIGS. 4A-4C illustrate signal traces showing the result of the full-wave rectifier function of block 305 of FIG. 3. FIG. 4A illustrates trace 401, the LF signal; FIG. 4B illustrates signal trace 403, the LFa signal; and FIG. 4C illustrates signal trace 405, the LFb signal. These signals (LF, LFa, and LFb) are also illustrated in FIG. 3. In FIG. 4A, as illustrated in trace 401, the LF signal is approximately a sine wave with the peak-to-peak voltage approximately centered at the voltage labeled VCL in trace 401. In FIGS. 4B and 4C, traces 403 and 405 show that the approximate maximum voltage for both the LFa and LFb signals is VCL. The VCL voltage level is the same in the three traces 401, 403, and 405 of FIGS. 4A-4C. The signals LFa and LFb are generated by the rectifier portion of the limiter and rectifier circuit (block 305 of FIG. 3). The LFb signal is the inverted LF signal and is limited to the maximum voltage of approximately VCL. The LFa signal is the LF signal (not inverted) that is limited to the maximum voltage of approximately VCL. The rectifier circuit in the example of FIG. 3 generates LFa and LFb signals that depart from a sine wave waveform shape during the time periods 407 and 409, respectively, of FIGS. 4B and 4C. Departure from a sine wave waveform shape is not critical to the description of the example embodiment and is not further described herein for simplicity of explanation. Rectifiers that generate other waveforms similar to or deviating from sine wave lobe shapes may also be used.

The voltage level VCL illustrated in all traces of FIGS. 4A-4C is the output of the transponder power supply. For a transponder that can be powered by energy harvested from the LF field, the transponder power supply stores this harvested energy in a circuit element such as a capacitor.

Transponders can be powered by a battery or other energy source in addition to being powered by energy harvested from the LF field. For such a transponder, energy is supplied by the battery (or other energy source) when energy harvested from the LF field is insufficient to maintain the minimum voltage level of VCL The minimum voltage level of VCL is dependent upon the implementation of a specific transponder and is not described herein. Also, for such a transponder, VCL may exceed the voltage of the battery (or other energy source) when energy harvested from the LF field produces a voltage greater that the voltage of the battery. In such a case, a power management function that is part of the transponder power supply prevents reverse current flow into the battery or other energy source. For a transponder operating with only the energy harvested from the LF field (without a battery or other energy source or with a discharged battery), the VCL level will typically ramp up to approximately half of the peak-to-peak voltage of the LF signal produced by the reader in the antenna tank circuit (301 of FIG. 3). In such a case, using a peak-to-peak LF signal of 6V, VCL ramps to approximately 3V. When the reader completes the downlink transmission and stops generating the LF field, energy stored in the transponder is depleted while the transponder is processing the downlink data and transmitting the uplink data. As this energy is depleted, VCL ramps down (below 3V in this example). In such a case, the transponder may be, for example, implemented to complete the uplink transmission before VCL ramps below 2.5V. The example embodiment is applicable to transponders powered by different types of energy sources. For simplicity of explanation, only transponder operation with LF field energy harvesting is described herein. The power supply is not further described herein.

For simplicity of explanation, the traces of FIGS. 4A-4C do not illustrate the following: typical losses in the antenna tank circuit (301 of FIG. 3): modulation with uplink or downlink data; energy being added to the tank circuit by the pluck circuit (block 317 of FIG. 3); and voltage limiting by limiter and rectifier circuit (block 305 of FIG. 3).

Figure 5:
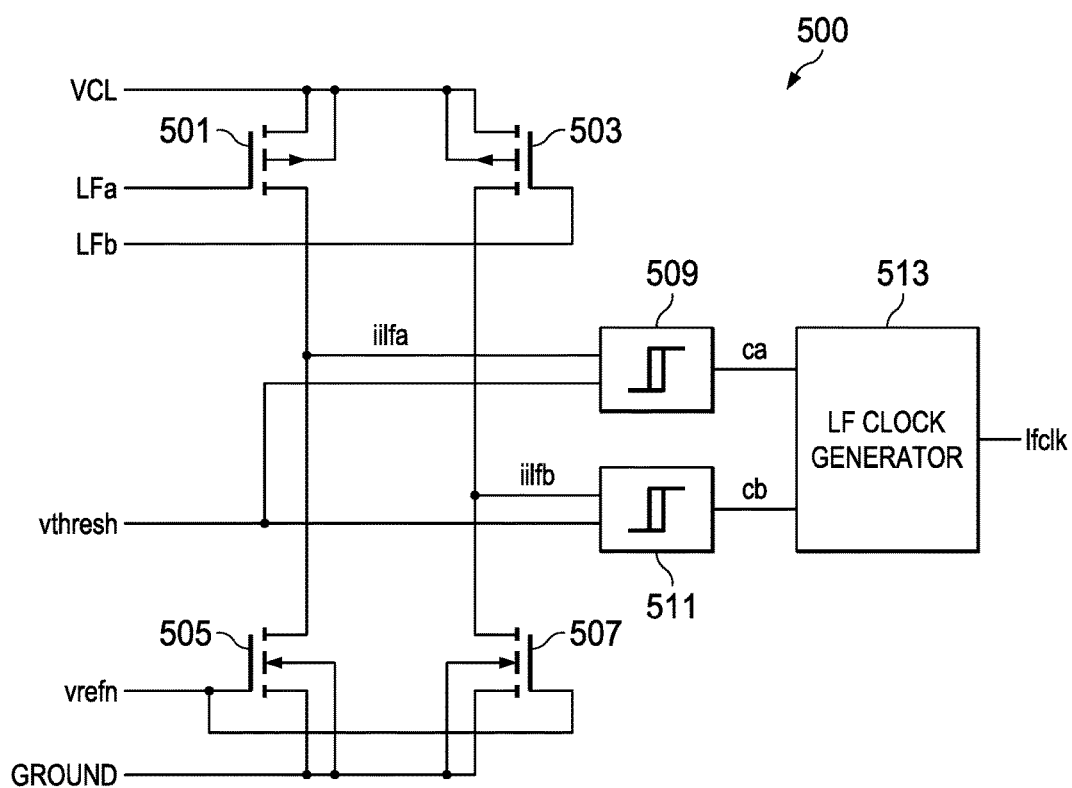
FIG. 5 is a circuit diagram for an example embodiment for a clock regenerator circuit.

FIG. 5 is a circuit diagram for an example embodiment clock regenerator circuit 500. Circuit 500 corresponds to block 307 in FIG. 3. Using the LFa and LFb signals described hereinabove as inputs, the clock regenerator circuit outputs the logic level clock signal labeled lfclk in both FIGS. 5 and 3.

FIGS. 6A-6E are a group of signal traces and timing diagrams illustrating the behavior of selected signals from the circuit in FIG. 5. The signals LFa and LFb described hereinabove are traces 601 (FIG. 6A) and 603 (FIG. 6B), respectively.

Transistors 505 and 507 of FIG. 5 are constant current sources. The gates of both of these transistors are connected to the signal labeled vrefn in FIG. 5. The voltage level of the vrefn signal is set external to FIG. 5 and is not described herein for simplicity of explanation. The gates of transistors 501 and 503 of FIG. 5 are coupled to the LFa and LFb signals respectively. The source terminals of transistors 501 and 503 are coupled to the drain terminals of transistors 505 and 507 of FIG. 5 respectively and labeled as signals iilfa and iilfb respectively in FIG. 5. The signal labeled VCL in FIG. 5 is the power supply voltage, and the signal labeled "ground" in FIG. 5 is the power supply ground. The drain and body terminals of transistors 501 and 503 are coupled to VCL. The source and body terminals of transistors 505 and 507 are coupled to ground.

When the voltage of signal LFa drops below the power supply voltage, VCL, (for example at event 621 in trace 601 of FIG. 6A), signal iilfa ramps from approximately ground to approximately VCL as illustrated in trace 605 of FIG. 6C. When signal LFa returns to VCL (for example at event 623 of FIG. 6A), signal iilfa ramps to approximately ground as illustrated in trace 605 of FIG. 6C. Similarly, when the voltage of signal LFb drops below VCL (for example at event 625 in trace 603 of FIG. 6B), signal iilfb ramps from approximately ground to approximately VCL as illustrated in trace 607 of FIG. 6D. When the voltage of signal LFb returns to VCL (for example at event 627 of FIG. 6B), signal iilfb ramps to approximately ground as illustrated in trace 607 of FIG. 6D.

The circuits 509 and 511 of FIG. 5 are voltage comparators with hysteresis. The inputs to the comparator 509 of FIG. 5 are the signals labeled iilfa and vthresh in FIG. 5. The inputs to the comparator 511 of FIG. 5 are the signals labeled iilfb and vthresh in FIG. 5. The voltage level of the vthresh signal is illustrated in traces 605 and 607 of FIGS. 6C and 6D, respectively. The outputs of the comparators 509 and 511 of FIG. 5 are the logic level signals labeled ca and cb respectively in FIG. 5 and illustrated in traces 609 and 611 of FIG. 6E.

Figure 6A:
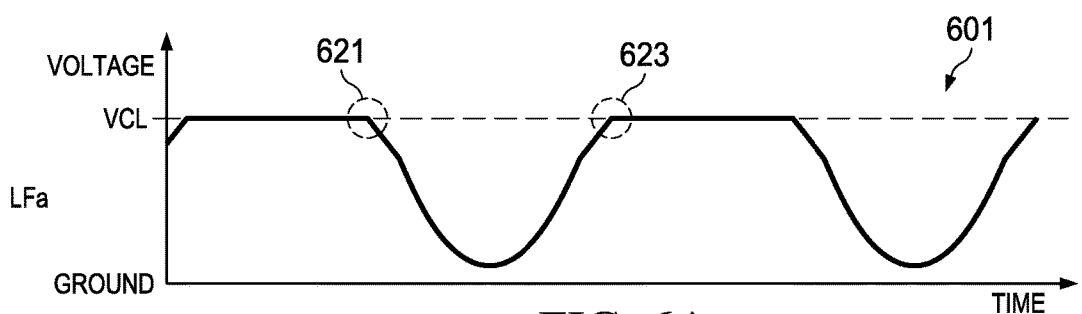
FIGS. 6A-6E are timing diagrams and traces for signals for the embodiment of FIG. 5.
Figure 6B:
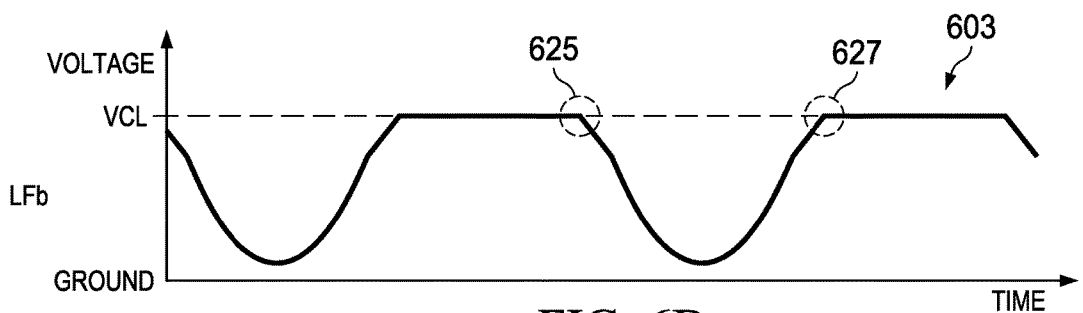
Figure 6C:
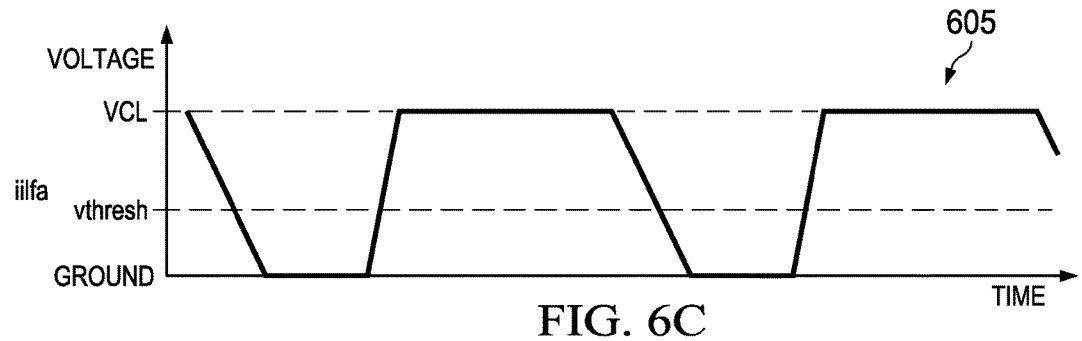
Figure 6D:
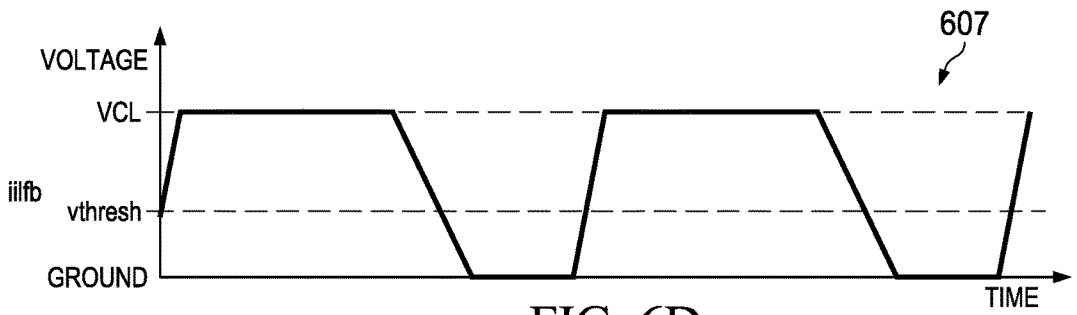
Figure 6E:
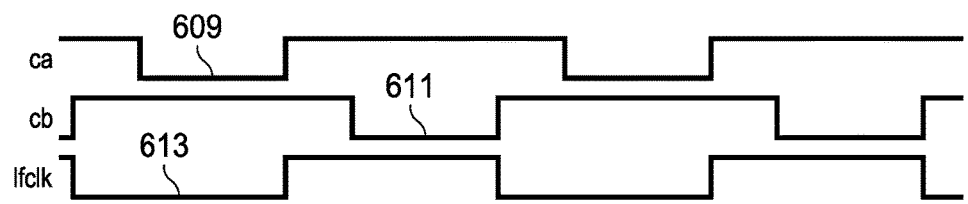

The output of comparator 509 of FIG. 5 (signal ca) transitions from low to high when the signal iilfa voltage is ramping up and reaches the approximate level of the vthresh signal as illustrated in traces 605 and 609 of FIG. 6C and FIG. 6E, respectively. The output of comparator 509 of FIG. 5 (signal ca) transitions from high to low when the signal iilfa voltage is ramping down and drops to the approximate level of the vthresh signal, as illustrated in traces 605 and 609 of FIG. 6C and FIG. 6E, respectively. Similarly, the output of the comparator 511 of FIG. 5 (signal cb) transitions from low to high when the signal iilfb voltage is ramping up and reaches the approximate level of the vthresh signal as illustrated in traces 607 and 611 of FIGS. 6D and 6E. The output of the comparator 511 of FIG. 5 (signal cb) transitions from high to low when the signal iilfb voltage is ramping down and drops to the level of the vthresh signal as illustrated in traces 607 and 611 of FIGS. 6D and 6E, respectively.

The "LF clock generator" circuit (block 513 of FIG. 5) can be implemented with a state machine or by another circuit with the functionality described now. The LF clock generator circuit inverts the logic state of the output, signal lfclk as illustrated in trace 613 of FIG. 6E when either signal, ca or cb (traces 609 and 611 of FIG. 6E), transitions from low to high. This approach for generating the lfclk signal results in an approximate 50% duty cycle of the lfclk signal.

Figure 7:
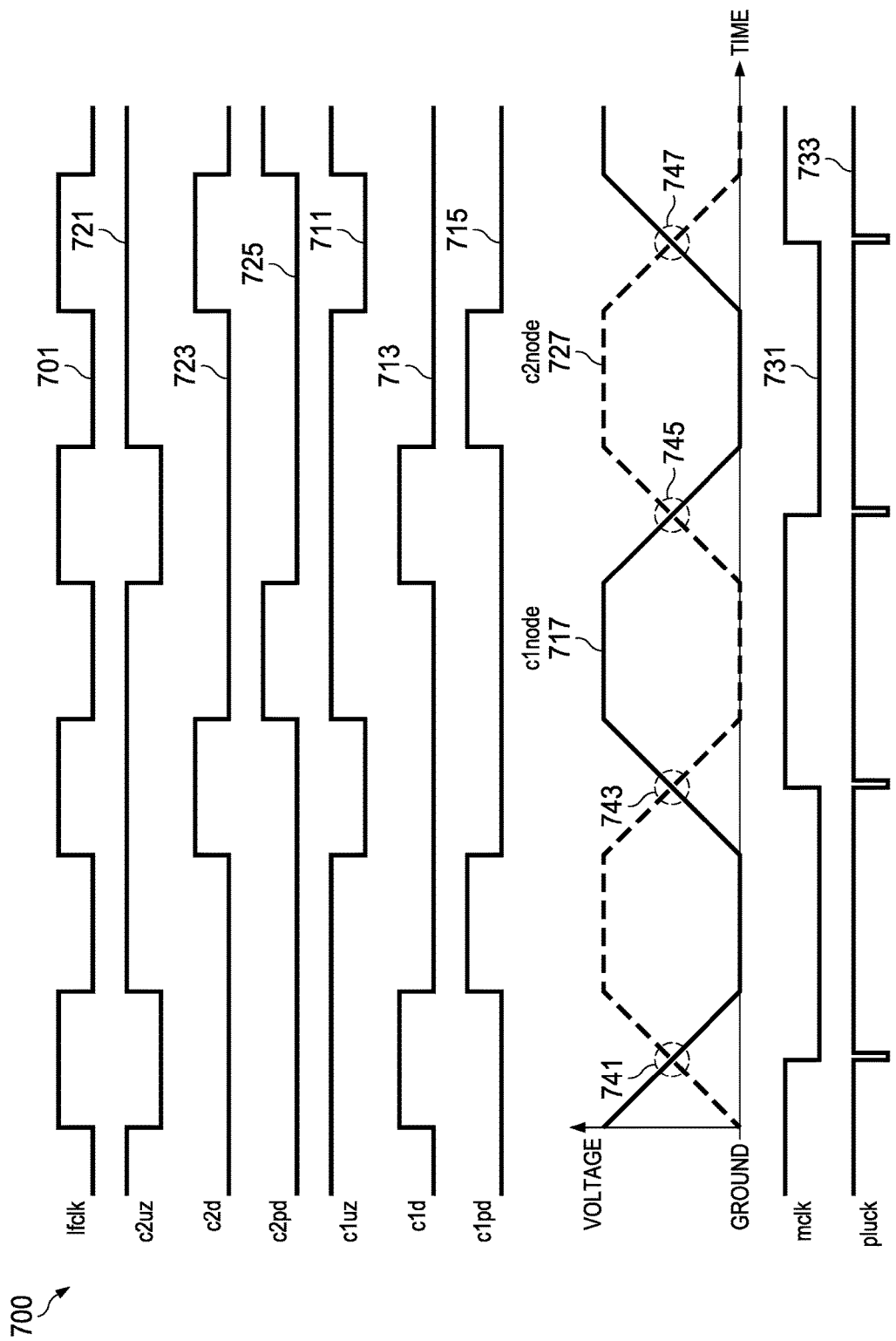
FIG. 7 is a timing diagram with a set of traces illustrating the input and output signal behavior of example embodiments for timing logic, oscillator timing, and pluck pulse generator circuits.

FIG. 7 illustrates a group of traces and timing diagrams 700 the input and output signal behavior of the example embodiment timing logic, oscillator timing, and pluck pulse generator circuits (such as blocks 309, 313, and 315 respectively of FIG. 3).

The example embodiment timing logic circuit (block 309 of FIG. 3) input is the signal lfclk (trace 613 of FIG. 6E and also shown as trace 701 of FIG. 7). The output of the timing logic circuit (block 309 of FIG. 3) are the logic signals $c1uz$, $c1d$, $c1pd$, $c2uz$, $c2d$, and $c2pd$ (traces 711, 713, 715, 721, 723, and 725 respectively of FIG. 7). The $c1uz$ signal pulses low for one half cycle of the lfclk signal every second cycle of lfclk when the lfclk is high. The $c2uz$ signal is the $c1uz$ signal delayed by one cycle of the lfclk signal. The $c1d$ signal is the $c2uz$ signal inverted. The $c2d$ signal is the $c1uz$ signal inverted. The $c1pd$ signal is the $c1d$ signal delayed by one-half cycle of the lfclk signal. The $c2pd$ signal is the $c2d$ signal delayed by one-half cycle of the lfclk signal. It should be noted that while the signals $c1d$, $c1pd$, $c2uz$, $c2d$, and c2*pd* are described above as being directly or indirectly based on the c1*uz* signal, other approaches to generating these signals with the timing illustrated in FIG. 7 are possible and form additional alternative embodiments. The example embodiment timing logic circuit (block 309 of FIG. 3) could be implemented with a state machine or other type of circuit that generates the output signals c1*uz*, c1*d*, c1*pd*, c2*uz*, c2*d*, and c2*pd* (traces 711, 713, 715, 721, 723, and 725 respectively of FIG. 7) with the timing relationships to the lfclk signal (trace 701 of FIG. 7) as described hereinabove.

Adding energy to the antenna tank circuit (301 of FIG. 3) when the LFa signal reaches minimum voltage (refer to event 411 of FIG. 4B) during each cycle of the LF signal improves transponder efficiency. The example embodiment employs a "dual slope" timing circuit as part of the example embodiment oscillator timing circuit (block 313 of FIG. 3) to establish the approximate time of event 411 of FIG. 4B in each cycle of the LF signal. The "dual slope" is the crossing pattern illustrated in traces 717 and 727 of FIG. 7. The dual slope approach is affected less by variations of circuit component characteristics and operating conditions than timing circuits typically employed in conventional approaches. Thus the time that event 411 of FIG. 4B occurs is more accurately determined by the dual slope approach. The advantages of more accurately identifying the time of event 411 of FIG. 4B and the approach used by the embodiment to generate the dual slope pattern and derive timing from the dual slope pattern are described in detail hereinbelow.

FIG. 8 is circuit diagram for an example embodiment oscillator timing circuit 800. Circuit 800 corresponds to block 313 in FIG. 3. As illustrated in FIG. 3 the signals c1*uz*, c1*d*, c1*pd*, c2*uz*, c2*d*, and c2*pd* (traces 711, 713, 715, 721, 723, and 725 respectively of FIG. 7) are coupled to the inputs of circuit 800. The master clock signal mclk (trace 731 of FIG. 7) is coupled to the output of circuit 800.

Transistors CS1U, CS1D, CS2U, and CS2D of FIG. 8 are parts of current mirrors and are employed as current sources. Transistors CS1U and CS2U provide approximately constant current for charging capacitors C1 and C2, respectively, of FIG. 8. Transistors CS1D and CS2D discharge capacitors C1 and C2, respectively, of FIG. 8 with approximately constant current. The portion of the current mirrors that generate the reference voltages (signals labeled refp and refn in FIG. 8) are not illustrated and are not described herein for simplicity of explanation. The signal labeled VDD in FIG. 8 is the power supply voltage. The signal labeled "ground" in FIG. 8 is the power supply ground.

In the example embodiment 800 of FIG. 8, the transistors labeled SW1PD, SW1U, SW1D, SW2PD, SW2U, and SW2D are employed as switches.

The c1node and c2node waveforms illustrated in trace 717 and 727 of FIG. 7 are generated by circuit 800 continuously when the transponder is powered on and the enable signals (not described herein) are active. The c1node and c2node signals (nodes 801 and 803 respectively of FIG. 8) are the approximate voltage levels across capacitors C1 and C2, respectively. Traces 717 and 727 (c1node and c2node signals, respectively) are drawn on the same axes in FIG. 7 to illustrate the times at which the slopes of waveforms cross. Four such crossing events are illustrated in FIG. 7 (events 741, 743, 745, and 747.)

The generation of signal c1node (FIG. 8 and trace 717 of FIG. 7) is now described. When the c1*uz* signal (FIG. 8 and trace 711 of FIG. 7) transitions low, switch SW1U turns on. (Switches SW1D and SW1PD have been turned off prior to SW1U turning on.) When switch SW1U is on, approximately constant current is supplied by transistor CS1U, charging capacitor C1. This approximately constant current supplied by transistor CS1U results in the slope of the c1node signal (trace 717 of FIG. 7) being approximately linear while C1 is charging, as illustrated in FIG. 7. When the signal c1*uz* (FIG. 8 and trace 711 of FIG. 7) transitions high, switch SW1U turns off. While SW1U is off and switches SW1D and SW1PD remain off, the c1node signal remains at approximately a constant voltage level. When c1*d* (FIG. 8 and trace 713 of FIG. 7) transitions high, switch SW1D turns on, allowing capacitor C1 to discharge through transistor CS1D. The transistor CS1D regulates the capacitor C1 discharge such that the current is approximately constant. This approximately constant discharge current results in the c1node signal (trace 717 of FIG. 7) having an approximately linear slope while C1 discharges, as illustrated in FIG. 7. When the c1*d* signal (FIG. 8 and trace 713 of FIG. 7) transitions high and turns off switch SW1D, approximately simultaneously, the c1*pd* signal (FIG. 8 and trace 715 of FIG. 7) transitions high. While c1*pd* is high, switch SW1PD is on, holding the c1node signal (trace 717 of FIG. 7) at approximately ground. When c1*pd* transitions low turning off switch SW1PD, approximately simultaneously, c1*uz* (FIG. 8 and trace 711 of FIG. 7) transitions low, and the cycle described in this paragraph repeats.

The generation of signal c2node (FIG. 8 and trace 727 of FIG. 7) is now described. When the c2*uz* signal (FIG. 8 and trace 721 of FIG. 7) transitions low, switch SW2U turns on. (Switches SW2D and SW2PD have been turned off prior to SW2U turning on.) When SW2U is on, approximately constant current is supplied by transistor CS2U, charging capacitor C2. The approximately constant current supplied by transistor CS2U results in the slope of the c2node signal (trace 727 of FIG. 7) being approximately linear while C1 is charging as illustrated in FIG. 7. When the signal c2*uz* (FIG. 8 and trace 721 of FIG. 7) transitions high, switch SW2U turns off. While SW2U is off and switches SW2D and SW2PD remain off, the c2node (trace 727 of FIG. 7) signal remains at approximately a constant voltage level. When c2*d* (FIG. 8 and trace 723 of FIG. 7) transitions high, switch SW2D turns on allowing capacitor C2 to discharge through transistor CS2D. The transistor CS2D regulates the capacitor C2 discharge such that the current is approximately constant. This approximately constant discharge current results in the c2node signal (trace 727 of FIG. 7) having an approximately linear slope while C2 discharges as illustrated in FIG. 7. When the c2*d* signal (FIG. 8 and trace 723 of FIG. 7) transitions high and turns off switch SW2D, approximately simultaneously, the c2*pd* signal (FIG. 8 and trace 725 of FIG. 7) transitions high. While c2*pd* is high switch SW2PD is on, holding the c2node signal (trace 727) at approximately ground. When c2*pd* transitions low turning off switch SW2PD, approximately simultaneously, c2*uz* (FIG. 8 and trace 721 of FIG. 7) transitions low and the cycle described in this paragraph repeats.

Circuit 805 of FIG. 8 is a voltage comparator with hysteresis. The c1node and c2node signals in FIG. 8 are coupled to the inputs of the comparator (805 of FIG. 8). The output of the comparator (805 of FIG. 8) is the logic level master clock signal labeled mclk in FIG. 8 and illustrated in FIG. 7 (trace 731). When the c1node and c2node signals are approximately the same voltage (examples are labeled events labeled 741, 743, 745, and 747 in FIG. 7), the output of comparator 805 of FIG. 8 (the mclk signal) transitions to the opposite state.

Near each crossing event of the c1node and c2node signal levels (event 743 of FIG. 7, for example), it is possible that noise will result in the comparator (805 of FIG. 8) making multiple rapid transitions that are not blocked by the hysteresis of the comparator. To approximately eliminate the effects of noise, additional circuitry can be included in the example embodiment that rapidly discharges the capacitors C1 and C2. Capacitor C1 is rapidly discharged when c1node voltage is ramping down at a crossing event (at event 745 of FIG. 7, for example) and after the output of comparator (805 of FIG. 8) initially transitions between logic states in response to the same crossing event (event 745 of FIG. 7 in this example). Capacitor C2 is rapidly discharged when c2node voltage is ramping down at a crossing event (at event 747 of FIG. 7, for example) and after the output of comparator (805 of FIG. 8) initially transitions between logic states in response to the same crossing event (event 747 of FIG. 7, is this example). The additional embodiment circuitry to rapidly discharge capacitors C1 and C2, and the effect on the c1node and c2node traces, is not illustrated herein for simplicity of explanation.

The master clock signal mclk (trace 731 of FIG. 7) generated by the comparator 805 of FIG. 8 is half the frequency of the lfclk signal (trace 701 of FIG. 7), and the mclk signal transitions occur at the approximate mid-point of the high level pulses on lfclk. Thus each edge of the mclk signal occurs at approximately the same time that the LFa signal reaches minimum voltage (refer to event 411 of FIG. 4).

FIG. 9 is the circuit diagram 900 for the example embodiment pluck pulse generator circuit (corresponding to block 315 of FIG. 3). The pluck pulse generator circuit 900 generates a short duration logic low pulse on the signal labeled "pluck" in FIG. 9 following each transition of the logic level master clock signal labeled mclk. The input mclk signal is coupled to one input of the exclusive nor gate (903 of FIG. 9). The pluck signal is coupled to the output of the exclusive nor gate (903 of FIG. 9). The mclk signal is also coupled to the input of a number of logic gates connected in series (901 of FIG. 9). The series of gates 901 of FIG. 9 is illustrated as four logic buffers, but other logic gate or buffer arrangements are possible. The output of the series of logic gates 901 is the signal labeled mclkd. The period of the mclkd signal is approximately equivalent to the period of the mclk signal. The phase of mclkd is delayed compared to mclk by the approximately propagation delay through the gates 901 of FIG. 9. Thus the mclkd signal is the delayed approximate equivalent of the mclk signal. The delayed signal mclkd is coupled to one input of the exclusive nor gate 903 of FIG. 9. Following each transition of the mclk signal, the state of the mclkd signal remains in the logic state opposite to that of mclk for a period of time. The period of time is approximately equivalent to the propagation delay through the gates 901 of FIG. 9. Therefore, the exclusive nor gate 903 of FIG. 9 generates a low level logic pulse on the pluck signal following each transition of the master clock signal mclk. The pulse stream on the pluck signal is illustrated in trace 733 of FIG. 7.

Circuit 900 of FIG. 9 can be implemented such that the duration of the pulses on the pluck signal (trace 733 of FIG. 7) is typically a small fraction of the mclk signal period. For a specific implementation of the embodiment, the maximum and minimum duration of the pulse on the pluck signal over variations in circuit component characteristics, temperature, and voltage is selected such that the circuitry operates as intended for an application.

FIG. 10 is an example circuit diagram 1000 for the embodiment pluck circuit (block 317 of FIG. 3). Transistor 1001 of FIG. 10 functions as a switch and is on when the signal labeled npor in FIG. 10 is a logic low. The signal npor is an enable signal not described herein for simplicity of explanation.

A pluck signal corresponding to the pluck signals of FIGS. 3 and 9 is coupled to the gate of transistor 1003 of FIG. 10. The signal LFa of FIG. 3 is coupled to the drain of transistor 1003 through transistor 1001. Transistor 1003 functions as a switch. When the pluck signal is in the logic high state, transistor 1003 is off, and the path from the LFa signal to ground is blocked. (The source of transistor 1003 is coupled to ground as illustrated in FIG. 10.) Leakage through transistor 1003 is not significant when it is off and is not described herein for simplicity of explanation. When the logic low pulse on the pluck signal occurs, transistor 1003 turns on, establishing a conduction path between the LFa signal and ground through the transistors 1001 and 1003. When the pluck signal returns to a logic high, the transistor 1003 turns off, blocking the conduction path from LFa to ground.

Figure 11A:
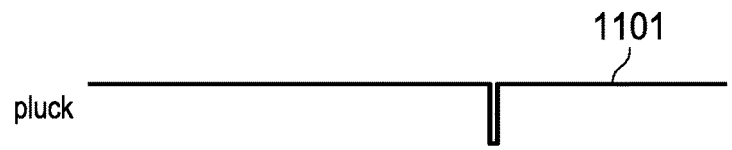
FIGS. 11A-11C are timing diagrams with a set of traces for signals illustrating the operation of the example embodiment pluck circuit of FIG. 10.
Figure 11B:
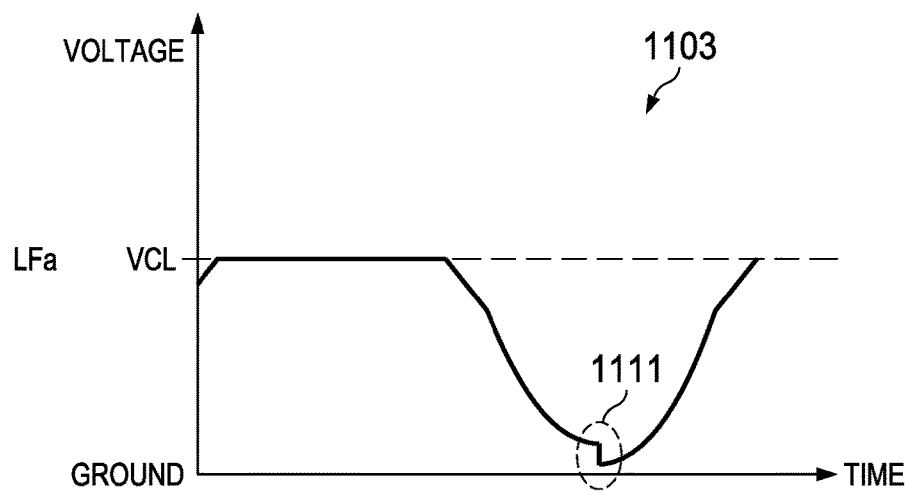
Figure 11C:
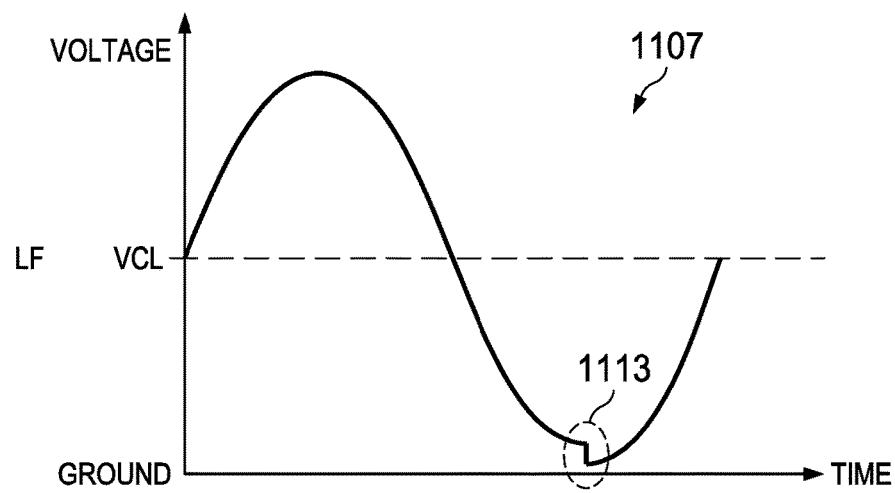

FIGS. 11A-11C each depict signal traces illustrating the operation of the pluck circuit of FIG. 10. Trace 1101 of FIG. 11A is the pluck signal of FIG. 10. Trace 1101 of FIG. 11A illustrates one of the pulses on the pluck signal (refer also to trace 733 of FIG. 7). Trace 1103 of FIG. 11B is the LFa signal. As described hereinabove, circuit 1000 establishes a conduction path to ground for the LFa signal (trace 1103 of FIG. 11B) when the low logic level pulse on the pluck signal (trace 1101 of FIG. 11A) occurs. This path to ground for the LFa signal exists for a period of time approximately equivalent to the duration of the pulse on the pluck signal. Event 1111 of FIG. 11B illustrates the change in trajectory of the LFa signal due to LFa being pulled toward ground by the example embodiment pluck circuit (see FIG. 10) in response to a pulse on the pluck signal. Trace 1107 of FIG. 11C is the voltage across the antenna tank circuit (such as 301 of FIG. 3), the LF signal, as described hereinabove. Beginning at event 1113 of FIG. 11C, the antenna tank circuit responds to the change in the LFa signal at event 1111. The peak-to-peak voltage level of the LF signal shown in FIG. 11C is thus increased at event 1113, resulting in an energy increase in the antenna tank circuit (for example, 301 of FIG. 3).

Referring to FIG. 7, trace 733 of FIG. 7 illustrates that a pulse on the pluck signal occurs once during each cycle of the lfclk signal (see trace 701 of FIG. 7) and thus once in each cycle of the LF signal (see trace 1107 of FIG. 11C). The result of the pluck signal occurring once in each cycle of LF signal is that energy is added to the antenna tank circuit (for example, 301 of FIG. 3) in each cycle of oscillation. The added energy improves efficiency of the transponder (circuit 300 of FIG. 3) and quality of the signal radiated by the antenna tank circuit (301 of FIG. 3).

The dual slope timing approach of the embodiments as described hereinabove results in more accurate timing for the addition of energy to the antenna tank (such as 301 of FIG. 3). The improved timing accuracy is due to comparing the voltages of two changing signals (c1node and c2node, illustrated in traces 717 and 727 respectively of FIG. 7) that are approximately equally affected by voltage, temperature, and circuit component characteristics. This additional timing accuracy is achieved due to the alternating direction of the voltage ramps for the c1node and c2node signals illustrated in traces 717 and 727 respectively of FIG. 7. Some timing asymmetries that may occur in portions of the transponder circuit will average to near zero cumulative timing error over two consecutive cycles of the LF signal. An example of such a timing asymmetry that is averaged to near zero is a difference in the charge and discharge rates of the c1node signal compared to the c2node signal. A second example of a timing asymmetry that is averaged to near zero are inaccuracies of the comparator 805 of FIG. 8. Thus, the use of the approach of the embodiments reduces the effect of these timing asymmetry characteristics.

In the various embodiments, the improved timing accuracy of the energy addition to the antenna tank circuit oscillation, as well as the approach of adding energy to the antenna tank circuit in each cycle of oscillation, results in improved power efficiency of the transponder and the quality of the uplink transmission.

Figure 12:
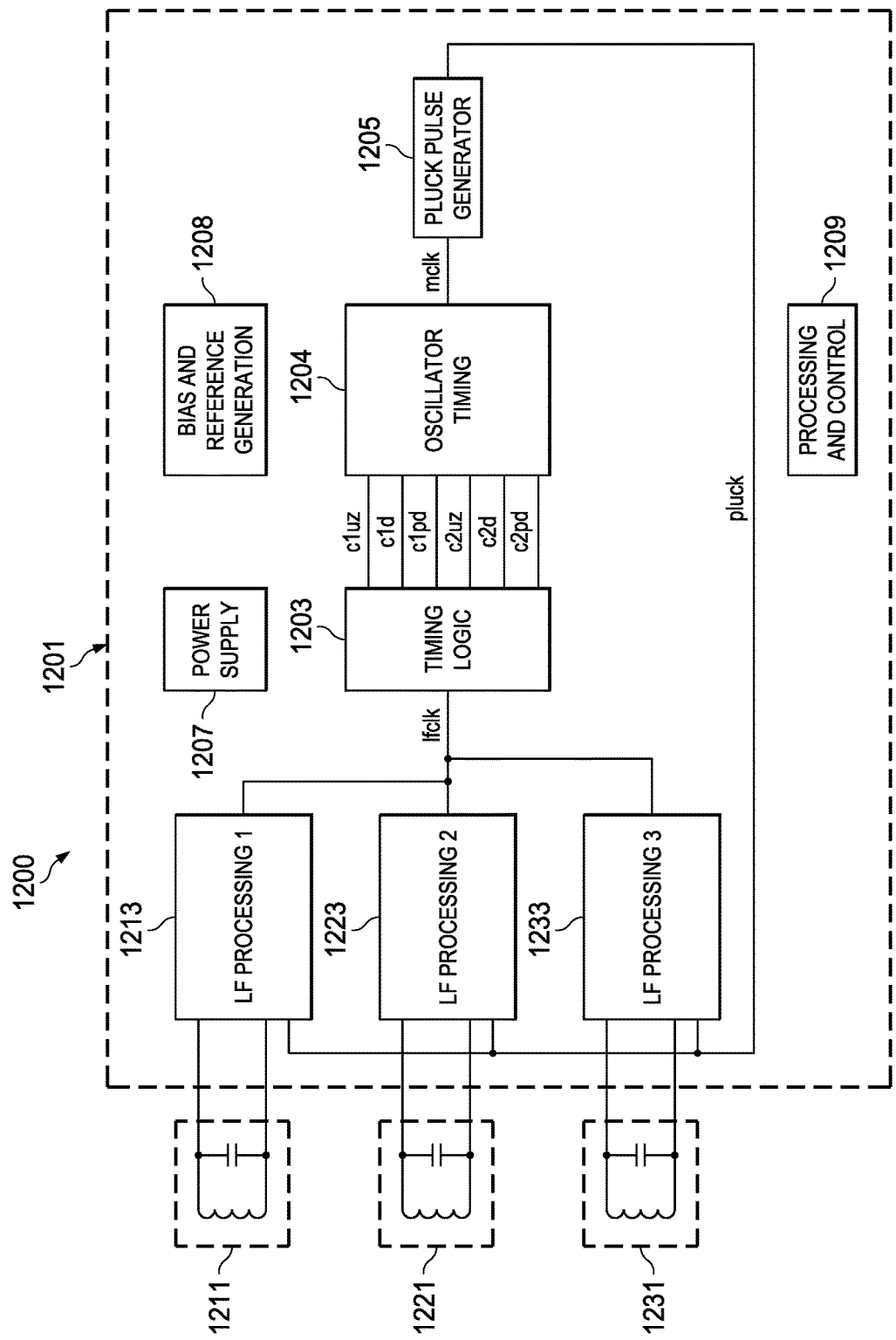
FIG. 12 is a block diagram of an example embodiment for a transponder circuit.

FIG. 12 is a block diagram of an example transponder circuit 1200. Circuit 1200 includes an IC 1201 and three antenna tank circuits (circuits 1211, 1221, and 1231) external to IC 1201. In an example implementation, the IC 1201 can be formed as a single integrated circuit. In additional example implementations, the IC 1201 can be formed using multiple integrated circuits and/or discrete components on a board or a module. Multiple integrated circuits can be packaged in a single unit, such as stacked die packages or multichip modules, for ease of use and to further increase integration. The IC1201 of FIG. 12 employs circuits corresponding to those illustrated in FIG. 3 as described hereinbelow. In addition, a typical transponder IC or module employs circuits including the following: "power supply;" "bias and reference generation;" and "processing and control" (blocks 1207, 1208, and 1209 respectively of FIG. 12). The operation and details of the blocks 1207, 1208, and 1209 of FIG. 12 are not described herein in detail for simplicity of explanation. Transponder implementations may include a battery external to IC1201. A battery is not illustrated in FIG. 12 for simplicity of explanation. Transponders may be implemented with external data and control connections for purposes such as individual transponder configuration. External data and control connections are not illustrated in FIG. 12 for simplicity of explanation.

The IC 1201 of FIG. 12 is implemented with three "LF processing" circuits labeled "LF processing 1," "LF processing 2," and "LF processing 3" (blocks 1213, 1223, and 1233 respectively of FIG. 12). The LF processing circuits (blocks 1213, 1223, and 1233 of FIG. 12) are individually coupled to the antenna tank circuits 1211, 1221, and 1231 respectively of FIG. 12. Each LF processing circuit (blocks 1213, 1223, and 1233 of FIG. 12) is an instantiation of a group of circuits corresponding to 321 of FIG. 3. The group of circuits 321 of FIG. 3 and thus each LF processing circuit (blocks 1213, 1223, and 1233 of FIG. 12) includes one instantiation of each the following circuits: example embodiment clock regenerator (corresponding to block 307 of FIG. 3), example embodiment pluck circuit (such as block 317 of FIG. 3), limiter and rectifier circuit (corresponding to block 305 of FIG. 3), and modulation capacitors circuit (such as block 303 of FIG. 3). The IC 1201 of FIG. 12 also includes one instantiation of the following circuits: example embodiment timing logic circuit (such as block 309 of FIG. 3 and block 1203 of FIG. 12), example embodiment oscillator timing circuit (corresponding to block 313 of FIG. 3 and block 1204 of FIG. 12), and example embodiment pluck pulse generator circuit (corresponding to block 315 of FIG. 3 and block 1205 of FIG. 12). The signals labeled lfclk, c1$uz$, c1$d$, c1$pd$, c2$uz$, c2$d$, c2$pd$, mclk, and pluck of FIG. 3 are also illustrated in FIG. 12.

The functionality of transponder 1200 of FIG. 12, employing three antennas, is similar to the functionality the single antenna transponder described hereinabove except as now described. The processing and control circuit (block 1209 of FIG. 12) selects one of the LF processing blocks (1213, 1223, and 1233 of FIG. 12) to output the lfclk signal in FIG. 12 and to respond to the pluck signal in FIG. 12. This selection of block 1213, 1223, or 1233 of FIG. 12 is based on the antenna tank circuit, 1211, 1221, or 1233 that is receiving the most energy from the LF field generated by the reader. That is, the LF processing block (1213, 1223, or 1233 of FIG. 12) with the greatest LF signal energy is selected. The following circuits are not illustrated in FIG. 12 and not described herein for simplicity of explanation: circuits for determining LF signal strength within each LF processing circuit (blocks 1213, 1223, or 1233 of FIG. 12); circuits for enabling the generation of the lfclk signal by one of these LF processing circuits; and circuits for enabling the response to the pluck signal by one of these LF processing circuits.

Alternative embodiments can be implemented with circuits or components that differ from those described hereinabove. For example, different types of transistors than those illustrated herein can be employed with corresponding circuit modifications for proper operation of the alternative embodiment. Alternative embodiments can be implemented with circuits that function differently than those described herein but that employ any one or more of the following: dual slope timing approach; short duration energy addition to the antenna tank circuit; and/or addition of energy to the antenna tank circuit in each cycle of antenna tank circuit oscillation, as described hereinabove. Additionally, signals described as logic level signals hereinabove can be implemented with analog signals and corresponding circuit modifications for proper operation of the alternative embodiment.

Figure 13:
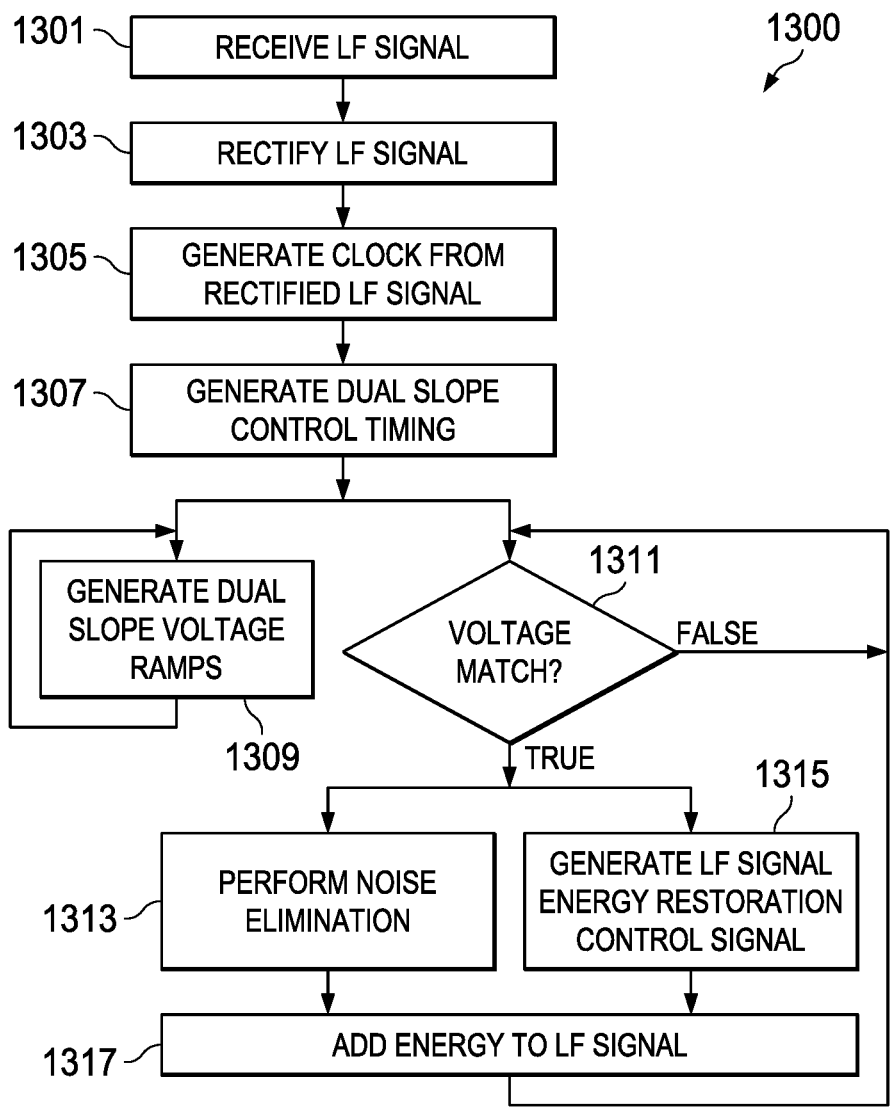
FIG. 13 is a flow diagram for a method embodiment.

FIG. 13 illustrates in a flow diagram an example method embodiment 1300. Method 1300 begins at step 1301, in which a low frequency radio (LF) signal is received. The LF signal is received continuously. From step 1301 the method transitions to step 1303.

At step 1303 the LF signal is rectified into two signals LFa and LFb. Each of the LFa and LFb signals are the LF signal, now half-wave rectified. The half-wave rectifying functions generating the LFa and LFb signal operate approximately 180 degrees out of phase. For example, in the case of the LF signal being an approximate sine wave, the LFa signal is approximately a constant voltage during the first half cycle of the LF sine wave and is approximately equivalent to the LF waveform (second lobe of the LF sine wave) during the second half cycle of the LF sine wave. In this example, the LFb signal is approximately equivalent to the inverted LF waveform (inverted first lobe of the LF sine wave) during the first half cycle of the LF sine wave and is approximately a constant voltage during the second half cycle of the LF sine wave. The LFa and LFb signals are generated continuously. From step 1303 the method transitions to step 1305.

At step 1305 a clock (lfclk) is generated from the LFa and LFb signal (refer to step 1303). The frequency of lfclk and the LF signal (refer to step 1301) are approximately the same. The LF signal and lfclk are approximately 180 degrees out of phase. The lfclk duty cycle is approximately 50%. To generate lfclk, the LFa and LFb signals are converted to clocks ca and cb. Clocks ca and cb will typically have strong duty cycle distortion. To generate lfclk with approximately a 50% duty cycle and the above described phase relationship with the LF signal, sequential rising and falling lfclk edges are generated when specific transitions occur on the ca and cb clocks. For example, a specific implementation of the method could employ rising edges occurring alternately on the clocks ca and cb to generate sequential rising and falling edges of lfclk. Generation of lfclk as described above functions continuously. From step 1305 the method transitions to step 1307.

At step 1307 odd and even cycles of lfclk (see step 1305) are designated. The next consecutive cycle of lfclk following an odd cycle is an even cycle. The next consecutive cycle of lfclk following an even cycle is an odd cycle. The first full cycle of lfclk can be arbitrarily designated as either odd or even. The alternating odd and even cycles of lfclk occur continuously. From step 1307 the method transitions to steps 1309 and 1311. Steps 1309 and 1311 function simultaneously.

At step 1309, a determination is made of whether the next lfclk cycle is odd or even (see step 1307). At the beginning of an odd lfclk cycle, a voltage (c1node) begins ramping from a maximum voltage to a minimum voltage, and a second voltage (c2node) begins ramping from a minimum voltage to maximum voltage. The slopes (voltage vs. time) of these voltage ramps are approximately linear and continue for approximately one-half cycle of lfclk (except as described in step 1313). During the second half of the current odd lfclk cycle, the voltages c1node and c2node remain approximately constant at the respective voltage levels that existed at the end of the first half of the current odd lfclk cycle. At the beginning of an even lfclk cycle, the voltage c2node begins ramping from a maximum voltage to a minimum voltage, and the voltage c1node begins ramping from a minimum voltage to maximum voltage. The slopes (voltage vs. time) of these voltage ramps are approximately linear and continue for approximately one-half cycle of lfclk (except as described in step 1313). During the second half of the current even lfclk cycle, the voltages c1node and c2node remain approximately constant at the respective voltage levels that existed at the end of the first half of the current even lfclk cycle. The method functions as intended when implemented such that c1node and c2node, during the above described ramps, momentarily, reach the same voltage during the first half of each lfclk cycle. From step 1309 the method repeats step 1309. Step 1309 operates continuously.

At step 1311 a comparison is made. If the voltages c1node and c2node (see step 1309) are approximately equal, the comparison is true and the method transitions to steps 1313 and 1315. Steps 1313 and 1315 function simultaneously.

At step 1313 a noise elimination function is performed. For the voltage (c1node or c2node) that is ramping with a negative slope, the voltage ramp is stopped and the voltage is rapidly changed to the minimum level when the comparison in step 1311 is true. For example, in the first half of an odd lfclk cycle, the voltage c1node is ramping with a negative approximately linear slope as described in step 1309. In this example, the trajectory of this slope (if the ramp were to continue) would reach the minimum voltage for c1node approximately at the end of the first half of the current odd cycle. Instead of the c1node voltage continuing on the linearly sloped ramp when the comparison of step 1311 becomes true, the c1node voltage is rapidly changed to the minimum voltage for c1node before the end of the first half of the current odd cycle. Step 1313 approximately eliminates multiple true comparisons that might otherwise occur in step 1311 due to signal or circuit noise during a single cycle of lfclk. In an even cycle of lfclk, the above example is applicable to the c2node voltage. From step 1313 the method transitions to step 1317.

At step 1315 the "pluck" timing signal is generated. The pluck signal is employed in step 1317 to control timing for restoration of LF signal energy. The pluck signal is generated approximately immediately following a true comparison in step 1311. The duration of the pluck signal is a small fraction of the lfclk period (see step 1305). The operation of method 1300 results in the pluck signal occurring approximately coincident with the LF signal reaching minimum voltage in each cycle of the LF signal. From step 1315 the method transitions to step 1317.

Returning to step 1311, if the comparison is false, the method repeats step 1311.

At step 1317 energy is added to the LF signal (see step 1301) to sustain oscillation of the LF signal. Energy is added to the LF signal by increasing the peak-to-peak voltage of the LF signal in the current cycle of the LF signal. To increase the peak to peak voltage of the LF signal, the minimum voltage peak of the LF signal is decreased. This decrease of the minimum voltage peak occurs approximately simultaneously with the occurrence of the pluck signal (see step 1315). Energy to reduce the minimum voltage peak of the LF signal is applied to the LF signal for a duration approximately equivalent to the duration of the pluck signal. The output of method 1300 is the energy transferred to the LF signal in step 1317. From step 1317 the method transitions to step 1311.

Note that the order of steps and the concurrent operation of steps illustrated in the example embodiment of FIG. 13 illustrate one approach to performing the method. Alternative embodiments can be formed using a different order of steps and different steps operating concurrently. Alternate embodiments can be implemented with functionality differing from the example embodiment 1300. These functional differences can include the following: the phase of the LF signal used to generate the signals LFa and LFb can be changed by 180 degrees; using alternating half cycles of the LF signal to generate lfclk in lieu of the LFa and LFb signals; the designation of the odd and even lfclk cycles can be reversed; lfclk can be in phase with the LF signal; the slope directions of c1node and c2node voltage ramps can be reversed in odd and even lfclk cycles; and c1node and c2node voltage ramps can occur in the second half cycle of lfclk. Employing alternate functionality may require that additional alternate functions be used or other modifications to the embodiment. For example, if lfclk is generated in phase with the LF signal, then the ramp of voltages c1node and c2node would occur in the second half cycle of each lfclk cycle and the c1node and c2node voltages would remain approximately constant in the first half cycle of each lfclk cycle. In alternative embodiments step 1313 can be omitted. When omitting step 1313, a true comparison in step 1311 results in the method transitioning only to step 1315 and not to both steps 1313 and 1315.

Modifications are possible in the described embodiments, and other embodiments are possible, within the scope of the claims.

What is claimed is:

1. A method, comprising:
    receiving a radio frequency signal at a first antenna;
    forming a first rectified waveform signal from the received radio frequency signal, the first rectified waveform signal having a constant level portion and a second portion corresponding to half of a waveform of the received radio frequency signal;
    forming a second rectified waveform signal from the received radio frequency signal having a constant level portion and a second waveform portion that is of opposite phase to the second portion of the first rectified waveform signal;
    forming a regenerated clock signal from the first rectified waveform signal and the second waveform rectified signal;
    forming a first periodic sloped waveform signal having a linear slope from the regenerated clock signal;

forming a second periodic sloped waveform signal having a linear slope from the regenerated clock signal, the second periodic sloped waveform signal being of opposite phase as the first period sloped waveform signal;
comparing the first periodic sloped waveform signal to the second periodic sloped waveform signal, and outputting a compare signal when the first periodic sloped waveform signal and the second periodic sloped waveform signal have equal magnitudes;
forming a third clock signal having transition edges corresponding to transitions in the compare signal; and
outputting a pulse waveform on a pluck signal responsive to the transition edges of the third clock signal.

2. The method of claim 1, in which the third clock signal has a frequency that is half of a frequency of the radio frequency signal.

3. The method of claim 1, and further comprising adding energy to at least a selected one of the first rectified waveform signal and the second rectified waveform signal, responsive to a pulse on the pluck signal.

4. The method of claim 1, and further comprising limiting a voltage magnitude of the first rectified waveform signal and of the second rectified waveform signal to a predetermined maximum voltage.

5. The method of claim 1, in which forming the first periodic sloped waveform signal further comprises coupling a capacitor to a node that is periodically charged and discharged according to logic signals derived from the first rectified waveform signal.

6. The method of claim 1, and further comprising supplying power received from the radio frequency signal from a resonant circuit that is coupled to an antenna, the resonant circuit further coupled to the first rectified waveform signal and to the second rectified waveform signal.

7. The method of claim 1, and further comprising outputting the pluck signal at a time when the first rectified signal is at a maximum amplitude.

8. The method of claim 1, and further comprising outputting the pluck signal at half the period of the second portion of the first rectified waveform signal.

9. The method of claim 1, in which the first rectified waveform signal is coupled to a ground potential responsive to the pluck signal.

10. The method of claim 1, and further comprising:
receiving the radio frequency signal at a second antenna and receiving the radio frequency signal at a third antenna:
rectifying the radio frequency signal at the second antenna and at the third antenna to form additional rectified signals; and
selecting the first rectified waveform signal and the second rectified waveform signal from rectified signals formed from the radio frequency signal received at a selected one of the first, second and third antennas.

11. Circuitry, comprising a resonant circuit for receiving a radio frequency signal;
a rectifier coupled to the resonant circuit to output a first rectified signal having a waveform with a constant level portion and a portion matching a first portion of the radio frequency signal, and to output a second rectified signal having a constant level portion and a portion that matches a second portion of the radio frequency signal and is out of phase with the first rectified signal;
a clock regenerator circuit coupled to receive the first and second rectified signals and to output a clock waveform corresponding to the first and second rectified signals;
a timing logic circuit coupled to the clock regenerator circuit to output logic signals corresponding to portions of the clock waveform;
an oscillator timing circuit receiving the logic signals to form a first periodic sloped waveform having a linear slope corresponding to a first portion of the clock waveform and to form a second periodic sloped waveform having a linear slope and corresponding to a second portion of the clock waveform, and comparators to compare the first periodic sloped waveform and the second periodic sloped waveform to output a master clock signal having transitions when the first periodic sloped waveform and the second periodic sloped waveform have equal magnitudes; and
a pluck pulse generator coupled to the master clock signal to output a pulse of a predetermined length on a pluck signal when the master clock signal transitions.

12. The circuitry of claim 11, and further including an amplifier circuit to couple the first rectified signal and a ground potential responsive to the pulse on the pluck signal.

13. The circuitry of claim 11, and further including circuitry to provide power to the circuitry from energy received from the radio frequency signal.

14. The circuitry of claim 11, in which the comparators in the oscillator timing circuit include hysteresis.

15. An integrated circuit transponder, comprising:
a rectifier circuit coupled to receive radio frequency signals from a first resonant circuit and to form a first rectified signal and to form a second rectified signal;
voltage limiter circuitry coupled to limit the first rectified signal and the second rectified signal to a predetermined amplitude;
a clock regenerator circuit coupled to receive the first rectified signal and the second rectified signal and to output a regenerated clock waveform corresponding to the first and second rectified signals;
a timing logic circuit coupled to the clock regenerator circuit to output logic signals corresponding to portions of the regenerated clock waveform;
an oscillator timing circuit receiving the logic signals to form a first periodic sloped waveform having a linear slope corresponding to a first portion of the regenerated clock waveform, and to form a second periodic sloped waveform having a linear slope and corresponding to a second portion of the regenerated clock waveform, and including comparators to compare the first periodic sloped waveform and the second periodic sloped waveform, the oscillator timing circuit coupled to output a master clock signal having transitions when the first periodic sloped waveform and the second periodic sloped waveform have equal magnitudes; and
a pluck pulse generator circuit coupled to the master clock signal to output a pulse of a predetermined length on a pluck signal when the master clock signal transitions.

16. The integrated circuit transponder of claim 15, and further comprising an amplifier coupled to at least one of the first rectified signal and the second rectified signal, the amplifier to add energy to the first rectified signal or the second rectified signal responsive to the pulse on the pluck signal.

17. The integrated circuit transponder of claim 15, and further including at least one antenna coupled to the resonant circuit.

18. The integrated circuit transponder circuit of claim 17, and further including:
a second resonant circuit coupled to a second antenna, and a third resonant circuit coupled to a third antenna;

a second rectifier circuit coupled to the second resonant circuit and coupled to output third and fourth rectified signals; and a third rectifier circuit coupled to the third resonant circuit and coupled to output fifth and sixth rectified signals;

the clock regenerator circuit selectively coupled to the third and fourth rectified signals and the fifth and sixth rectified signals, depending on a strength of the respective rectified signals output from the first, second and third resonant circuits.

19. The integrated circuit transponder of claim 15, in which the pluck pulse generator circuit further includes a logic gate circuit coupled to a delay line to form a pulse of a duration corresponding to a delay length of the delay line.

20. The integrated circuit transponder of claim 15, in which the integrated circuit transponder is mounted in a vehicle ignition system.

* * * * *